United States Patent [19]

Nagaraj et al.

[11] Patent Number: 5,208,546
[45] Date of Patent: May 4, 1993

[54] ADAPTIVE CHARGE PUMP FOR PHASE-LOCKED LOOPS

[75] Inventors: Krishnaswamy Nagaraj, Macungie, Pa.; Reza S. Shariatdoust, Spotswood, N.J.

[73] Assignee: AT&T Bell Laboratories, Murray Hill, N.J.

[21] Appl. No.: 748,136

[22] Filed: Aug. 21, 1991

[51] Int. Cl.$^5$ ................ H03K 17/00; H03L 7/00
[52] U.S. Cl. ................ 328/155; 307/262; 331/1 A; 331/17; 331/25
[58] Field of Search ......... 328/155; 307/262, 269; 331/1 A, 17, 25

[56] References Cited

U.S. PATENT DOCUMENTS

| | | | |
|---|---|---|---|
| 3,610,954 | 10/1971 | Treadway | 328/133 |
| 4,524,333 | 6/1985 | Iwata et al. | 328/155 |
| 4,885,554 | 12/1989 | Wimmer | 328/155 |
| 4,890,072 | 12/1989 | Espe et al. | 328/155 |
| 4,920,320 | 4/1990 | Matthews | 328/155 |

OTHER PUBLICATIONS

F. M. Gardner, *Phaselock Techniques*, 123-25 (1979).

Primary Examiner—Timothy P. Callahan
Attorney, Agent, or Firm—Thomas A. Restaino

[57] ABSTRACT

A method and apparatus for improving the performance of a phase-locked loop are disclosed. A phase error between two signals is sensed and a temporary increase in the bandwidth of the phase-locked loop is provided responsive to the sensed phase error. The phase-locked loop may comprise a charge pump and the temporary increase in the bandwidth of the phase-locked loop may comprise a temporary increase in charge pump current. An increase in phase-locked loop bandwidth is followed by a decrease in the bandwidth responsive to a decrease in phase error. The decrease in bandwidth may comprise a decrease in charge pump current.

15 Claims, 2 Drawing Sheets

ADAPTIVE CHARGE PUMP FOR PHASE-LOCKED LOOPS

FIELD OF THE INVENTION

The present invention relates generally to phase-locked loops and more specifically to charge pumps for phase-locked loops.

BACKGROUND OF THE INVENTION

A basic phase-locked loop (PLL) is a circuit which produces an output signal synchronized to an input reference signal. A PLL output signal is synchronized or "locked" to a reference signal when the frequency of the output signal is the same as that of the reference signal. Under locked conditions, a PLL may provide for a constant phase difference between the reference and output signals. This phase difference may assume any desired value including zero. Should a deviation in the desired phase difference of such signals develop (i.e., should a phase error develop) due to, e.g., variation in either (i) the frequency of the reference signal or (ii) programmable parameters of the PLL, the PLL will attempt to adjust the frequency of its output signal to drive the phase error toward zero.

There are several different types of PLLs. Among these are PLLs which are charge pump-based. In a charge pump-based PLL, a phase-frequency detector compares an input reference signal to an output signal from a voltage controlled oscillator for the purpose of observing phase and frequency differences between the signals. If differences are observed, the phase-frequency detector produces logic pulses indicative of such differences. A charge pump receives these logic pulses and, based thereon, provides pulses of current to a loop filter and ultimately the voltage controlled oscillator. As filtered, these current pulses serve to adjust the voltage controlled oscillator to compensate for the observed differences.

The magnitude of PLL bandwidth is a parameter affecting PLL performance. The larger the bandwidth, the larger the steady-state phase jitter (i.e., the larger the phase error due to circuit noise) of the PLL but the smaller the settling time for variations in the reference signal or PLL parameters (i.e., the smaller the time needed by the PLL to adjust to the variations). The smaller the PLL bandwidth, the smaller the steady-state phase jitter, but the larger the settling time. Consequently, a PLL design trade-off issue can exist between desirable values of steady-state phase jitter and reference signal/PLL parameter variation settling time.

SUMMARY OF THE INVENTION

The present invention provides a method and apparatus for temporarily providing an increased PLL bandwidth responsive to variations or transients in a reference signal or programmable loop parameters, and a narrow bandwidth during the steady-state.

An illustrative embodiment of the present invention comprises an adaptive charge pump which operates to employ a relationship between the magnitude of charge pump current and PLL bandwidth. This relationship provides that increases in charge pump current tend to increase PLL bandwidth, while decreases in current tend to decrease PLL bandwidth. The embodiment provides for sensing the above-described variations and, responsive thereto, temporarily increasing the magnitude of charge pump current. The increased charge pump current increases PLL bandwidth and therefore decreases settling time of a PLL in response to such variations. Once PLL output signal phase has been modified to track the variations, the charge pump current is reduced, reducing PLL bandwidth and steady-state phase jitter. The temporary nature of an increase in charge pump current provides for enhanced PLL settling properties, as needed, without a sustained increase in PLL steady-state phase jitter.

The illustrative embodiment of the present invention functions by operation of a variation sensor in combination with a variable current source. The variation sensor monitors the outputs of a PLL's phase-frequency detector for the presence of logic pulses indicating a variation to be tracked. Responsive to sensing significant logic pulses, the variation sensor signals the variable current source that increased current should be provided to the loop filter and VCO of the PLL to improve settling time. The variable current source responds by increasing the magnitude of its output current pulses, thereby increasing PLL bandwidth and providing for quicker adjustment to the sensed variation.

Once the voltage controlled oscillator of the PLL responds to the filtered current pulses by adjusting its output to track the variation, significant logic pulses from the phase-frequency detector cease. The variation sensor responds to the lack of significant logic pulses by de-asserting its signal to the variable current source, which, in response, reduces the magnitude of current pulses it produces.

The present invention has use in many systems such as clock signal synthesizer systems for, among other things, video graphics applications.

DETAILED DESCRIPTION

Introduction

Figure 1:
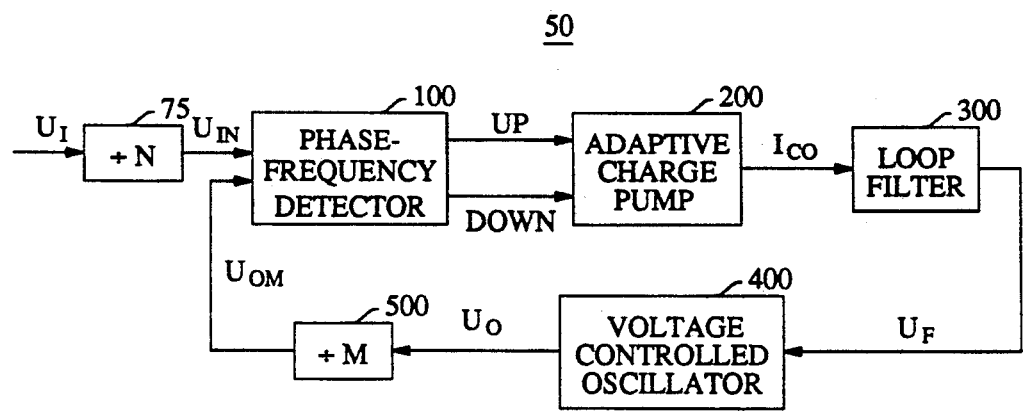
FIG. 1 presents an illustrative charge pump-based phase-locked loop.

An illustrative charge pump-based phase-locked loop (PLL) 50 is presented in FIG. 1. A reference signal $U_I$ is received by a digital programmable divider circuit 75, which divides the frequency of $U_I$ by a programmable value N. A resulting signal, $U_{IN}$, is provided to a phase-frequency detector (PFD) 100. Also provided to the PFD 100 is signal $U_{OM}$, which is the output of a voltage controlled oscillator (VCO) 400, $U_O$, divided by a number M by another digital programmable divider circuit 500. PFD 100 detects differences in phase and frequency between $U_{IN}$ and $U_{OM}$, and provides logic signals to an embodiment of an adaptive charge pump 200 indicating when such differences have been detected. By arbitrary convention these logic signals are designated as DOWN and UP, respectively. (It will be apparent to one of ordinary skill in the art that the opposite convention could be chosen.)

The adaptive charge pump 200 is coupled to a loop filter 300 and provides a charge pump output current, $I_{CO}$, to the loop filter 300 based on the received UP/-DOWN logic signals. The loop filter 300 provides low-pass filtering to $I_{CO}$, yielding a filtered signal $U_F$. This signal is provided as feed-back to the VCO 400.

The digital programmable dividers 75 and 500 in the illustrative embodiment may be any of those well known in the art. The illustrative PFD 100 may be any of the well-known types, such as that presented in FIG. 6.18 in F. M. Gardener, *Phaselock Techniques*, 123-25 (1979). The loop filter 300 of the illustrative embodiment is a first order low-pass filter. The illustrative VCO 400 comprises a voltage to current converter coupled to a ring oscillator which comprises three current controlled inverters.

The Adaptive Charge Pump

Figure 2:
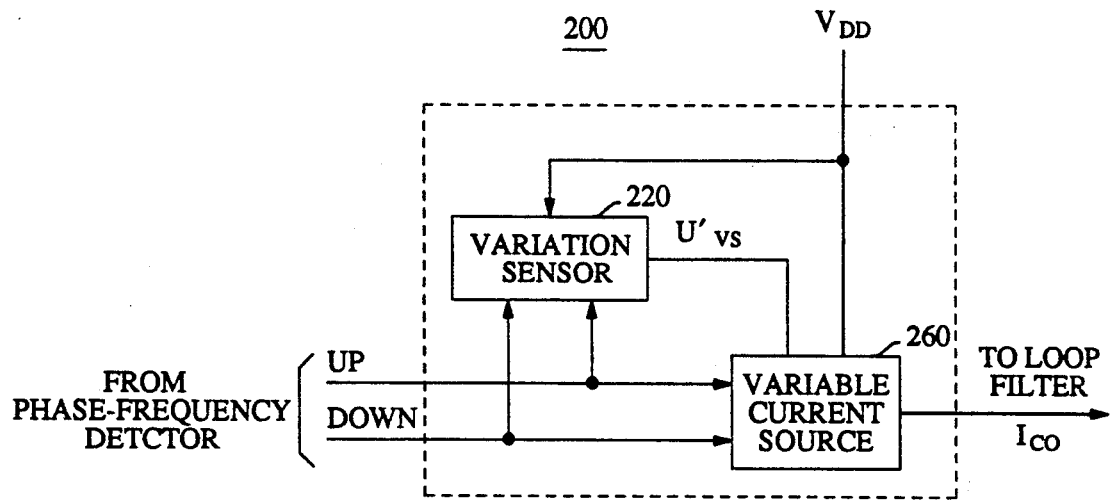
FIG. 2 presents an illustrative embodiment of the adaptive charge pump of the present invention.

The illustrative embodiment of the adaptive charge pump 200 is presented in FIG. 2. UP/DOWN logic signals from PFD 100 are provided to both a variation sensor (VS) 220 and a variable current source (VCS) 260. The VS 220 is coupled to VCS 260, and both are coupled to a power supply voltage, $V_{DD}$. Responsive to detecting significant UP/DOWN logic signals from the phase-frequency detector 100, the VS 220 sends a variation signal, $U'_{VS}$, to the VCS 260. The VCS 260 provides output current $I_{CO}$ to the loop filter 300 of the PLL 50.

The Variation Sensor

Figure 3:
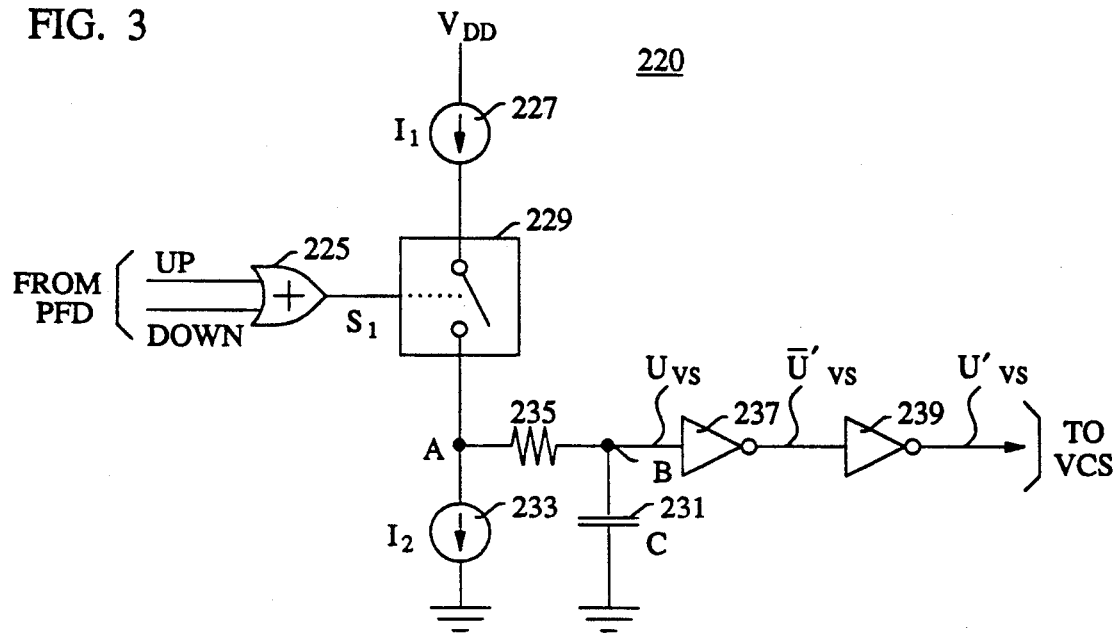
FIG. 3 presents an illustrative variation sensor.

An illustrative VS 220 is presented in FIG. 3. As shown in the Figure, the UP/DOWN logic signals from the PFD 100 are logically ORed by gate 225 to form signal $S_1$. Signal $S_1$ controls the operation of a switch 229, which in turn modulates the flow of current, $I_1$, from current source 227. Switch 229 will close during the intervals when signal $S_1$ is logically true. Resistor 235 is coupled to switch 229 at node A, along with current source 233. Capacitor 231 is coupled to resistor 235 at node B.

Current source 233 provides a current $I_2$ which is related to current $I_1$ as follows:

$$I_2 = \frac{I_1}{n},$$

where n is, for example, 10. The value of n determines the average duty cycle of $S_1$ deemed to be significant so as to cause an increase in VCS 260 output current. For example, for $I_1 = 20$ μA and $I_2 = 2$ μA (n=10), UP/DOWN logic pulses causing a duty cycle for $S_1 > 0.1$ (i.e., greater than 10 percent) will be deemed significant for purposes of variation sensing. (see, section entitled *Operation of the Illustrative Embodiment*).

The voltage signal at node B is designated as $U_{VS}$. This signal is received by inverter 237 which provides as output a logical TRUE signal whenever it receives an input signal which is less than or equal to a threshold, $V_{th}$. Inverter 237 will provide as output a logical FALSE signal whenever it receives an input signal which is greater than $V_{th}$. Because of this threshold, the inverted signal output from inverter 237 is indicated with a "prime" notation: $U'_{VS}$. This output is again inverted by inverter 239 to provide signal $U'_{VS}$. It is this signal, $U'_{VS}$, which is output to the VCS 260.

The Variable Current Source

Figure 4:
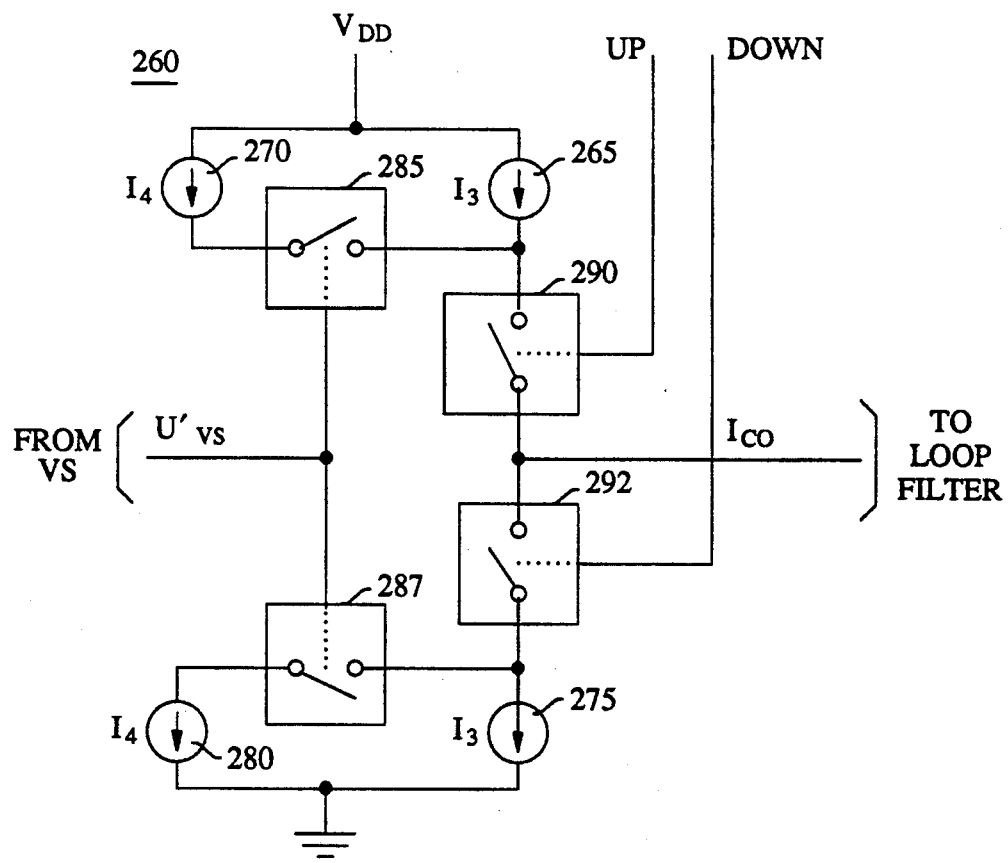
FIG. 4 presents an illustrative variable current source.

An illustrative variable current source 260 is presented in FIG. 4. As shown in the Figure, the VCS 260 includes two current sources, 265 and 275, which are directly modulated by the UP and DOWN logic pulse signals from the PFD 100 by operation of switches 290 and 292, respectively. VCS 260 also includes two current sources 270 and 280 which are modulated not only by the UP and DOWN logic pulse signals applied to switches 290 and 292, respectively, but also by signal $U'_{VS}$, by operation of switches 285 and 287, respectively. Exemplary values for $I_3$ and $I_4$ are 4 μA and 20 μA, respectively.

When signal $U'_{VS}$ is logically FALSE, the output current of the VCS 260, $I_{CO}$, may comprise current from either of sources 265 or 275, depending on the presence or absence of UP or DOWN logic pulse signals controlling switches 290 or 292, respectively. However, when signal $U'_{VS}$ is logically TRUE, the output current of the VCS 260 may comprise current from either of sources 265 or 275, depending on the presence or absence of UP or DOWN logic pulse signals, plus current from either source 270 or 280.

In light of the above, it will be understood by one of ordinary skill in the art that current sources controlled by switches in the VCS 260 and the VS 220 may comprise separate switches and sources, as presented in FIGS. 3 and 4, or unified switched current sources. Whether separate or together as a single element, such may be formed with field effect transistors using techniques well known in the art.

Operation of the Illustrative Embodiment

Under steady-state (e.g., locked) conditions, the UP/DOWN logic signals from PFD 100 are infrequent and of short duration, if present at all. As a result, the duty cycle, DS, of signal $S_1$ from OR gate 225 is very small or zero (e.g., less than 10 percent). Switch 229 will therefore remain open most of the time and current source 227 will be largely blocked. (Under steady-state conditions, some conventional PFDs provide narrow UP/DOWN spikes from time to time; as will be appreciated by the ordinary artisan, these spikes will not affect the fundamental operation of this embodiment.) At the same time, current source 233 is working to pull charge from capacitor 231 via resistor 235 at a rate of $I_2 = I_1/n$. Since $I_2 > I_1 \times DS$, the voltage across the capacitor, $U_{VS}$, is driven toward zero. The condition of $U_{VS} \leq V_{th}$ is sensed by the threshold logic of inverter 237, causing it to output a logical TRUE signal. In response, inverter 239 provides a logical FALSE signal, $U'_{VS}$, to switches 285 and 287 of VCS 260. This FALSE signal causes the switches to open (or allows them to remain open). VCS 260 output current, $I_{CO}$, is therefore equal to $I_3$, as provided by current source 265 or 275, when switch 290 or 292, respectively, is closed.

As a result of significant variations in the reference signal $U_I$, or in the programmable values of M and N (e.g., resulting in loss of lock), significant UP/DOWN logic pulse signals are produced. Accordingly, the duty cycle, DS, of signal $S_1$ is large (e.g., greater than 10 percent). Switch 229 will close whenever signal $S_1$ is TRUE. Each time switch 229 closes, current $I_1$ is allowed to flow and, as a result, charge is deposited on capacitor 231. If the current $I_1 \times DS$ (the rate at which charge is being deposited on the capacitor) exceeds the current $I_2$ (the rate at which charge is being drained from the capacitor), the voltage at node B, $U_{VS}$, will be driven toward the supply voltage, $V_{DD}$. The condition of $U_{VS} > V_{th}$ is sensed by the threshold logic of inverter 237, causing inverter 237 to output a logical FALSE signal. In response, inverter 239 provides a logical TRUE signal, $U'_{VS}$, to switches 285 and 287 which close in response. During the time when switches 285 and 287 are closed and UP/DOWN pulses are present, VCS 260 output current, $I_{CO}$, is equal to $I_3$, as provided by current source 265 or 275, plus $I_4$, as provided by current source 270 or 280. Responsive to increased output current, $I_{CO}$, the bandwidth of the PLL 50 is increased thus enhancing its variation settling properties.

As a result of the VCO 400 adjusting its output signal to reduce the PLL 50 phase error (between signal $U_{IN}$ and output signal $U_{OM}$) to a small, if not zero, level, the PFD 100 will cease generating significant UP/DOWN logic pulses. Absent such significant logic pulses, the voltage at node B of the VCS 260, $U_{VS}$, is driven toward zero by current source 233. The condition of $U_{VS} \geq V_{th}$ is sensed by the threshold logic of inverter 237 causing it to provide a logical TRUE signal as output. This signal is inverted by inverter 239 to a logical FALSE signal causing switches 285 and 287 to open. As a result, VCS 260 may provide output current equal to $I_3$ from sources 265 and 275, depending on the presence of UP/DOWN logic pulses at switches 290 and 292, respectively. Responsive to this level of output current, the PLL 50 exhibits a reduced level of phase jitter compared with that exhibited by the PLL 50 when its output current equals the sum of $I_3$ and $I_4$.

We claim:

1. In a phase-locked loop including a loop filter, an oscillator providing an output of the phase-locked loop, a phase detector, and a charge pump providing current to the loop filter, the current having a magnitude, a method of adjusting the bandwidth of the phase-locked loop, the method comprising the steps of:
   the phase detector sensing a phase error between a reference signal and the output signal of the phase-locked loop;
   the charge pump increasing the magnitude of charge pump current responsive to the phase error sensed by the phase detector and providing the charge pump current to the loop filter; and
   subsequent to increasing the magnitude of said current, the charge pump decreasing the magnitude of said current.

2. The method of the claim 1 wherein the charge pump increases and decreases the magnitude of the charge pump current by the same amount.

3. The method of claim 1 wherein the step of the charge pump decreasing the magnitude of the charge pump current is performed in response to a decrease in sensed phase error by the phase detector.

4. In a phase-locked loop including a loop filter, an oscillator, and a phase detector for detecting errors between a reference signal and an output signal of the loop, an adaptive charge pump for coupling to the phase detector and the loop filter in the phase-locked loop and for providing charge pump current to the loop filter, the charge pump current having a magnitude, the adaptive charge pump comprising:
   a. a variation sensor for determining when the magnitude of charge pump current provided to the loop filter should be increased, the determination to increase the magnitude of charge pump current based upon a phase error detected by the phase detector; and
   b. a variable current source, coupled with the variation sensor, for providing charge pump current to the loop filter and for providing
      1. an increase in the magnitude of charge pump current responsive to said determination by the variation sensor, and
      2. subsequent to providing said increase, a decrease in the magnitude of charge pump current.

5. The adaptive charge pump of claim 4 wherein the increase and decrease in the magnitude of charge pump current are equal.

6. The adaptive charge pump of claim 4 wherein the variable current source provides a decrease in the magnitude of charge pump current responsive to a decrease in phase error detected by the phase detector.

7. The adaptive charge pump of claim 4 wherein the variation sensor comprises:
   a capacitor;
   first current source means for producing a first current for use in charging the capacitor, said first current being provided responsive to a phase error detected by said phase detector;
   second current source means for producing a second current for use in discharging the capacitor; and
   means for determining when the magnitude of charge pump current should be increased responsive to a voltage across the capacitor.

8. The adaptive charge pump of claim 7 wherein the magnitude of the first current is substantially ten times the magnitude of the second current.

9. A phase-locked loop comprising:
   a. a phase detector for sensing a phase error between a reference signal and an output signal of the phase-locked loop;
   b. a loop filter, the loop filter for receiving charge pump current having a magnitude and for providing a filter output signal;
   c. a variation sensor for determining when the magnitude of said charge pump current received by the loop filter should be increased, the determination to increase the magnitude of said charge pump current based on a phase error sensed by the phase detector;
   d. a variable charge pump current source for providing charge pump current to the loop filter, and for providing
      1. an increase in the magnitude of said charge pump current responsive to said determination by the variation sensor, and
      2. subsequent to providing said increase, a decrease in the magnitude of said charge pump current; and
   e. an oscillator for providing the phase-locked loop output signal responsive to the filter output signal.

10. The phase-locked loop of claim 9 wherein the increase and decrease in the magnitude of said charge pump current are equal.

11. The phase-locked loop of claim 9 wherein the variable current source provides a decrease in the magnitude of said charge pump current responsive to a decrease in phase error detected by the phase detector.

12. The phase-locked loop of claim 9 further comprising a divider circuit, coupled between the phase detector and the oscillator, for dividing the frequency of the phase-locked loop output signal by a predetermined number.

13. The phase-locked loop of claim 12 further comprising a reference signal divider circuit, coupled to the phase detector, for dividing the frequency of the reference signal by a predetermined number.

14. The phase-locked loop of claim 13 wherein each of the divider circuits is independently programmable to allow selection of the predetermined number.

15. The phase-locked loop of claim 9 wherein the phase detector comprises a phase-frequency detector.

* * * * *